United States Patent
Kobori et al.

(10) Patent No.: US 9,250,996 B2
(45) Date of Patent: Feb. 2, 2016

(54) MULTICORE TYPE ERROR CORRECTION PROCESSING SYSTEM AND ERROR CORRECTION PROCESSING APPARATUS

(75) Inventors: Tomoyoshi Kobori, Tokyo (JP); Steffen Kunze, Dresden (DE); Emil Matus, Dresden (DE); Gerhard Fettweis, Dresden (DE)

(73) Assignees: NEC CORPORATION, Tokyo (JP); TECHNISCHE UNIVERSITAT DRESDEN, Dresden (DE)

( * ) Notice: Subject to any disclaimer, the term of this patent is extended or adjusted under 35 U.S.C. 154(b) by 276 days.

(21) Appl. No.: 13/877,650

(22) PCT Filed: Oct. 4, 2011

(86) PCT No.: PCT/JP2011/073281
§ 371 (c)(1),
(2), (4) Date: Oct. 15, 2013

(87) PCT Pub. No.: WO2012/046864
PCT Pub. Date: Apr. 12, 2012

(65) Prior Publication Data
US 2014/0040700 A1      Feb. 6, 2014

(30) Foreign Application Priority Data
Oct. 5, 2010    (JP) ................................. 2010-225403

(51) Int. Cl.
*G06F 11/10* (2006.01)
*H03M 13/11* (2006.01)
(Continued)

(52) U.S. Cl.
CPC ............ *G06F 11/1044* (2013.01); *G06F 5/015* (2013.01); *H03M 13/1102* (2013.01);
(Continued)

(58) Field of Classification Search
CPC ..................... H03M 13/1102; H03M 13/1105; H03M 13/1145; H03M 13/6513; H03M 13/6566; H03M 13/2978; H03M 13/2775; H03M 13/296; H03M 13/6577; H03M 13/6569; H03M 13/6508; H03M 13/114; H03M 13/1162; H03M 13/1171; G06F 11/1044; G06F 5/015

USPC ......... 714/763, 768, 769, 770, 773, 774, 786, 714/790, 799
See application file for complete search history.

(56) References Cited

U.S. PATENT DOCUMENTS 5,369,652 A * 11/1994 Bailey et al. .................. 714/755
6,304,927 B1 * 10/2001 Mishra et al. .................. 710/65
(Continued)

FOREIGN PATENT DOCUMENTS

JP    2000-196467 A    7/2000
JP    2002-176366 A    6/2002
(Continued)

OTHER PUBLICATIONS

G. M. Tharakan and S. M. Kang "A New Design of a Fast Barrel Switch Network" IEEE Journal of solid-state circuits. vol. 21. No. 2. Feb. 1992.*

(Continued)

*Primary Examiner* — John J Tabone, Jr.
(74) *Attorney, Agent, or Firm* — McGinn IP Law Group, PLLC.

(57) ABSTRACT

In a multicore type error correction processing system which can simultaneously cope with a plurality of error correction methods and a plurality of code lengths, an interconnect part 11 has a barrel shifter which extends across a plurality of error correction processing parts 12a-12c. An error correction process can be selectively performed by collectively using a group of the plurality of the error correction processing parts 12a-12c or by individually using each of individual error correction processing parts 12a-12c in response to interconnection configuration information. With this structure, the plurality of the error correction processing parts 12a-12c are collectively used if computation resources are insufficient and an idling error correction processing part is assigned to another error correction process if computation resources are excessive.

20 Claims, 6 Drawing Sheets

(51) Int. Cl.
  *H03M 13/00* (2006.01)
  *H03M 13/29* (2006.01)
  *H03M 13/27* (2006.01)
  *G06F 5/01* (2006.01)

(52) U.S. Cl.
  CPC ........ *H03M13/114* (2013.01); *H03M 13/1105* (2013.01); *H03M 13/1145* (2013.01); *H03M 13/1162* (2013.01); *H03M 13/1171* (2013.01); *H03M 13/2775* (2013.01); *H03M 13/296* (2013.01); *H03M 13/2978* (2013.01); *H03M 13/6508* (2013.01); *H03M 13/6513* (2013.01); *H03M 13/6566* (2013.01); *H03M 13/6569* (2013.01); *H03M 13/6577* (2013.01)

(56) References Cited

U.S. PATENT DOCUMENTS

| | | | |
|---|---|---|---|
| 6,788,617 B1* | 9/2004 | Lee | 365/240 |
| 8,707,123 B2* | 4/2014 | Liu et al. | 714/752 |
| 2001/0043758 A1* | 11/2001 | Yamaguchi et al. | 382/297 |
| 2002/0129317 A1 | 9/2002 | Nicol et al. | |
| 2002/0129320 A1 | 9/2002 | Bickerstaff et al. | |
| 2002/0162074 A1 | 10/2002 | Bickerstaff | |
| 2004/0117723 A1* | 6/2004 | Foss | 714/805 |
| 2009/0287956 A1* | 11/2009 | Flynn et al. | 714/6 |
| 2010/0005221 A1* | 1/2010 | Nieminen | 711/5 |
| 2010/0104096 A1* | 4/2010 | Jutla | 380/30 |
| 2010/0251059 A1* | 9/2010 | Dielissen | 714/752 |
| 2010/0268918 A1* | 10/2010 | Priewasser et al. | 712/208 |
| 2010/0293439 A1* | 11/2010 | Flynn et al. | 714/763 |
| 2010/0293440 A1* | 11/2010 | Thatcher et al. | 714/764 |
| 2011/0246862 A1* | 10/2011 | Graef | 714/785 |
| 2013/0027416 A1* | 1/2013 | Vaithianathan et al. | 345/557 |
| 2013/0091403 A1* | 4/2013 | Yang et al. | 714/763 |
| 2013/0179753 A1* | 7/2013 | Flynn et al. | 714/773 |
| 2014/0258775 A1* | 9/2014 | Flynn et al. | 714/6.21 |

FOREIGN PATENT DOCUMENTS

| | | |
|---|---|---|
| JP | 2009-095008 A | 4/2009 |
| WO | WO 2008/069231 A1 | 6/2008 |
| WO | WO 2009/151481 A2 | 12/2009 |

OTHER PUBLICATIONS

F. Naessens, et al., "A 10.37 mm2 675 mW reconfigurable LDPC and Turbo encoder and decoder for 802.11n, 802.16e and 3GPP-LTE", VLSI Circuits (VLSIC), 2010 IEEE Symposium on pp. 213-214, Jun. 18, 2010.

Japanese Office Action dated Sep. 17, 2014 with an English translation thereof.

"FlexiChaP: A reconfigurable ASIP for convolutional, turbo, and LDPC code decoding," M. Alles, T. Vogt, and N. Wehn, in Proc. Int. SyMposiuM on Turbo Coding (Turbo Coding '08), 2008, pp. 13-18.

"A Unified Instruction Set Programmable Architecture for Multistandard Advanced Forward Error Correction," Frederik Naessens, et al., IEEE Sips08, 2008, pp. 31-36.

* cited by examiner

MULTICORE TYPE ERROR CORRECTION PROCESSING SYSTEM AND ERROR CORRECTION PROCESSING APPARATUS

TECHNICAL FIELD

The present invention relates to a field of error correction process such as turbo decoding or LDPC decoding in wireless communication, and more particularly to a system having a parallel architecture using a multicore processor for aiming at a high throughput.

BACKGROUND ART

A high throughput and a high resistance to error have been required for recent wireless communication systems. In order to meet such demands, various techniques including error correction processes such as turbo coding, LDPC (Low Density Parity Check) coding, and convolutional coding have been used in a variety of wireless communication systems, such as LTE (Long Term Evolution) and WiMax. Those error correction processes, particularly decoding algorithms, require a large amount of bit processing and many repetitional processes and, as a result, need a great amount of calculations. Therefore, various proposals have been presented so far with regard to dedicated hardware engines suitable for decoding algorithms. Use of those dedicated hardware engines can provide a high throughput and high capability of error correction as required.

However, each of those dedicated hardware engines deals with a single decoding method in order to achieve high performance requirements. Herein, it is assumed that those dedicated hardware engines which would be a key technology to a next-generation wireless communication system are used in a software radio apparatus required for a multi-standard wireless system. In this event, such engines suitable for all of error correction algorithms used in a required communication method should be installed individually. In such a case, the scale of the circuit becomes large as an increase of the number of those dedicated hardware engines and results in an influence on the scale of the entire system. Furthermore, multiple types of dedicated hardware engines should be developed on all such occasions or on demand. This causes an increase of development cost.

With regard to those problems, there has been proposed a programmable engine that deals with multiple types of error correction algorithms Form the viewpoint of achieving a high throughput as required, proposals have been made about the architecture of the programmable engine formed by a single processor having a high operating frequency (see Non-Patent Document 1) or a plurality of processors arranged in parallel (see Non-Patent Document 2). The latter method using a plurality of processors would be effective in a wireless communication system in terms of a reduction of the electrical power consumption.

As shown in FIG. 6, a programmable engine disclosed in Non-Patent Document 2 includes a plurality of memory banks $50a$, $50b$, and $50c$, a plurality of error correction processing parts $52a$, $52b$, and $52c$, and an interconnect part 51. The memory banks $50a$-$50c$ are connected to the error correction processing parts $52a$-$52c$ via the interconnect part 51. Multiple sets of data can simultaneously be read from or written in each of the memory banks $50a$-$50c$. The engine having the above configuration as disclosed in Non-Patent Document 2 operates as follows:

It is assumed that each of the memory banks and the error correction processing parts is equal to N in number and that M words of data can simultaneously be read from or written in one of the memory banks. For the sake of brevity, FIG. 6 shows an example where N=3 and M=32. Input data for an error correction process are stored in the memory banks. A plurality of data that can simultaneously be accessed in one memory bank are referred to as a data row.

First, an operation for LDPC decoding will be described. Data rows are read from the memory banks $50a$-$50c$. The read data rows are subjected to a predetermined amount of shift in barrel shifters $51a$, $51b$, and $51c$ which are connected to the memory banks $50a$, $50b$, and $50c$, respectively. The amount of shift differs depending upon the type of LDPC coding. The shifted data rows are inputted to the error correction processing parts $52a$, $52b$, and $52c$. When the data rows are inputted to the error correction processing parts $52a$-$52c$, a program for LDPC decoding is executed in each of the error correction processing parts $52a$-$52c$, so that one repetition cycle of the LDPC decoding process is performed. The resultant computation results are outputted to the interconnect part 51. In the interconnect part 51, the inputted data rows are subjected to a reverse shift operation that is reverse to the shift operation performed at the time of input, so that the order of the data rows is recovered to the original one. The data rows in the original order are written back to the memory banks. This sequence is repeated a predetermined number of times. Thus, LDPC decoding for one code is conducted.

Next, an operation for turbo decoding will be described. In the case of the turbo decoding, the interconnect part 51 is operated in a different manner between an even number one of repetitive times and an odd number one of the repetitive times. When the repetition times are even, data rows inputted from the memory banks $50a$-$50c$ are inputted to the error correction processing parts $52a$-$52c$ without any change of the order of the data. When the repetition times are odd, data rows inputted from the memory banks $50a$-$50c$ are subjected to interleaving processing by a cross bar $51d$ of the interconnect part 51 and are inputted to the error correction processing parts $52a$-$52c$ after the order of the data has been changed. When the data rows are thus inputted, a program for turbo decoding is executed in the error correction process, so that a turbo decoding process is performed. The resultant computation results are subjected to de-interleaving depending upon whether the repetition times are even or odd like in the case of the input of the data rows from the memory banks and then are written back to the memory banks. This sequence is repeated a predetermined number of times. Thus, turbo decoding is conducted.

As described above, Non-Patent Document 2 can perform typical error correction processes, including LDPC decoding and turbo decoding, by the use of the same architecture.

As shown in FIG. 6, however, it should be pointed out that the architecture of Non-Patent Document 2 has limited or fixed connections between memory banks and the error correction processing parts. When multiple types of error correction methods are to be processed, only one type of error correction methods can be processed during a single operation in Non-Patent Document 2. This shows that a plurality of error correction processes should be successively or sequentially performed. Accordingly, even if a single error correction method is processed in connection with a certain code length an error correction process cannot be performed simultaneously on different code lengths from the certain code length. A next-generation wireless communication system, particularly a base station, requires decoding processes for a plurality of users. Furthermore, it would be desirable to effectively process a plurality of error correction methods and a plurality of code lengths. In most of the existing wireless communication systems, different error correction processes are performed for different communication channels. Thus, it would be desirable also to process a plurality of error correction methods and a plurality of different code lengths at one time.

CITATION LIST

Non-Patent Literature

Non-Patent Document 1: "FlexiChaP: A reconfigurable ASIP for convolutional, turbo, and LDPC code decoding," M. Alles, T. Vogt, and N. Wehn, in Proc. Int. SyMposiuM on Turbo Coding (TURBO CODING '08), 2008, pp. 13-18.

Non-Patent Document 2: "A UNIFIED INSTRUCTION SET PROGRAMMABLE ARCHITECTURE FOR MULTI-STANDARD ADVANCED FORWARD ERROR CORRECTION," Frederik Naessens, et al., IEEE Sips08, 2008, pp. 31-36.

SUMMARY OF INVENTION

Technical Problem

Problems to be solved by the present invention are that computation resources cannot be used effectively for a plurality of error correction methods or a plurality of code lengths in a multicore type error correction processing apparatus and that only one type of error correction process can be performed in one operation. This is because of limited or fixed connections between the memory banks and the error correction processing parts as in Non-Patent Document 2 shown in FIG. 6. When processes that meet various performance requirements are to be performed with this configuration, it is difficult to perform a plurality of error correction processes simultaneously or to provide computation resources suitable for the performance requirements. Particularly, a barrel shifter can only perform a single shift operation with a single amount of shift at one time in an LDPC decoding process. Therefore, in a case where a plurality of error correction processes are to be performed, or an LDPC decoding process is to be performed on different code lengths, each error correction process or each code length should be sequentially performed in Non-Patent Document 2.

The present invention has been made in order to solve the above problems. It is, therefore, an object of the present invention to provide a multicore type error correction processing system that can achieve efficient computation and data transfer to respective processing portions to meet various performance requirements and that can simultaneously perform error correction processes with a plurality of error correction methods and a plurality of code lengths.

Solution to Problem

According to an aspect of the present invention, there is provided a multicore type error correction processing system comprising a plurality of data storage parts, a data row conversion part for receiving data from the plurality of data storages and converting an order of data in a data row, and a plurality of error correction processing parts for receiving data from the data row conversion part and performing a predetermined error correction process based upon the parameter data stored in the external parameter storage part, wherein the data row conversion part performs a data row conversion in response to control information by using a barrel shifter operation which includes a rotation operation based upon a shift process and which collectively indicates a group of the plurality of the error correction processing parts to be outputted or which individually indicates the plurality of the error correction processing parts.

According to another aspect of the present invention, there is provided a multicore type error correction processing apparatus characterized by comprising: a plurality of memory banks; an interconnect part including a barrel shifter operable to receive data from the plurality of memory banks and to shift a data row of the data for converting an order of the data; an external interface operable to receive a control parameter from an exterior of the external interface; an external parameter holding part operable to store data received from the external interface; and a plurality of error correction processing parts operable to receive data from the interconnect part and perform a predetermined error correction process based upon a parameter stored in the external parameter holding part, wherein the error correction processing parts each include an error correction computation part and an error correction processing control part operable to control the error correction computation part so as to perform the error correction process based upon the parameter stored in the external parameter holding part, and the interconnect part performs a data row conversion using a barrel shifter operation which includes a rotation operation based upon a shift process and which collectively indicates a group of the plurality of error correction processing parts to be outputted or which individually indicates each of the plurality of error correction processing parts to be outputted.

In the multicore type error correction processing apparatus according to the above aspect, control parameters regarding the error correction processing parts are inputted to the interconnect part from the exterior of the apparatus or within the apparatus. The apparatus operates such that a barrel shifter in the interconnect part is configured to have one or more types of groups by those data. The object of the present invention can be achieved by using the above configuration and connecting a plurality of memory banks to a plurality of error correction processing parts via an interconnect part.

According to still another aspect of the present invention, there is provided a processing method comprising: receiving a data row and control information concerned with the data row; performing a barrel shifter operation of the data row in response to the control information to collectively indicate a group of a plurality of output devices or to individually indicate each of the output devices; and selectively processing the data row subjected to the barrel shifter operation by the group of the output devices or by the individual output devices.

The processing method may be used in a multicore type error correction processing system which includes: a plurality of data storages, a data row conversion part which receives data from the plurality of the data storages and which converts an order of data in the data row, an external input register which receives the control information, and a plurality of error correction processing parts as the output devices, the plurality of the error correction processing parts receiving data from the data row conversion part and performing a predetermined error correction process based upon the control information, wherein; the performing the barrel shifter operation comprising: receiving the control information; and carrying out, in response to the control information, the barrel shifter operation which includes a rotation operation based upon a shift process and which collectively indicates the group of the error correction processing parts as the output devices or which individually indicates each of the error correction processing parts as the output devices.

Advantageous Effects of Invention

With the above configuration, the following advantageous effects can be attained.

The present invention is advantageous in that a plurality of data rows having different configurations can simultaneously be processed. This is because an interconnect part is structured so that a plurality of species or groups are formed in response to a control parameter inputted from error correction processing parts or the exterior of the system.

DESCRIPTION OF EMBODIMENTS

Next, some embodiments of the present invention will be described in detail with reference to the drawings.

The following embodiments are applicable to a multicore type error correction processing system or error correction processing apparatus. The following embodiments describe a case in which the present invention is applied to a multicore type error correction processing apparatus.

First Exemplary Embodiment

Figure 1:
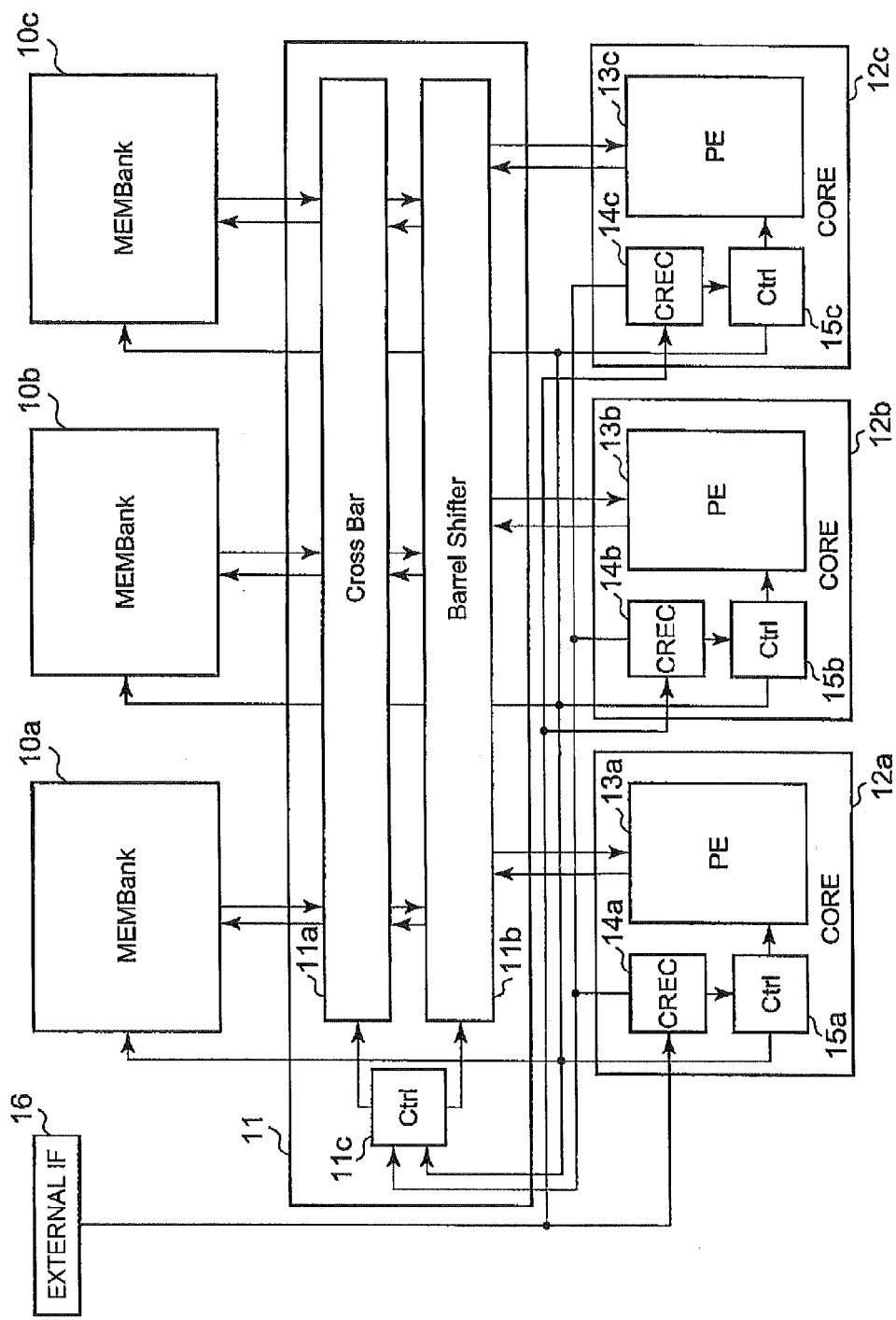
FIG. 1 is a block diagram showing an arrangement of an error correction processing apparatus according to a first embodiment of the present invention.

Referring to FIG. 1, a multicore type error correction processing apparatus according to a first embodiment of the present invention includes a plurality of memory banks 10a, 10b, and 10c, an interconnect part 11, and a plurality of error correction processing parts 12a, 12b, and 12c. For the sake of brevity, FIG. 1 shows an example of three memory banks and three error correction processing parts. As a matter of course, the present invention is not limited to three memory banks and three error correction processing parts. This holds true for other embodiments described later.

The memory banks 10a-10c are used to store data to be processed (referred to as input data), data being computed, and the results. The interconnect part (data row conversion means or part) 11 includes a cross bar 11a primarily used in turbo decoding process, a barrel shifter 11b used in an LDPC decoding process, and an interconnect control part 11c operable to control the group configuration, operation, and the like. The interconnect part 11 is connected to the error correction processing parts as well as the memory banks The error correction processing parts 12a-12c each perform an error correction process. The error correction processing parts 12a-12c are connected to the interconnect part 11. The error correction processing parts 12a, 12b, and 12c respectively include error correction computation parts 13a, 13b, and 13c operable to actually process received input data and error correction processing control parts 15a, 15b, and 15c operable to control the error correction computation parts 13a, 13b, and 13c. The error correction computation parts 13a-13c may be called processing elements (abbreviated to PE) while the processing control parts 15a-15c may be abbreviated to Ctrl. The error correction processing control parts 15a-15c also serve to generate memory addresses for the memory banks 10a, 10b, and 10c and interconnect parameters required for the interconnect part 11. The error correction processing parts 12a, 12b, and 12c further include configuration data holding parts (external parameter storage means or registers) 14a, 14b, and 14c operable to hold configuration parameters indicative of how to group the error correction processing parts 12a, 12b, and 12 and the interconnect part 11. The configuration data holding registers 14a, 14b, and 14c are abbreviated to CREG. In the illustrated example, the configuration parameters are received from an external IF (interface) (external input means) 16.

Those components operate as follows.

The memory banks 10a, 10b, and 10c are controlled by the error correction processing control parts 15a, 15b, and 15c. The memory banks 10a, 10b, and 10c receive addresses generated by the error correction processing control parts 15a, 15b, and 15c and output data stored in those addresses to the interconnect part 11. Furthermore, the memory banks 10a, 10b, and 10c store data outputted from the interconnect part 11 into addresses generated by the error correction processing control parts 15a, 15b, and 15c. M data can be accessed simultaneously in one memory bank by one address where M is an integer not less than 2.

The error correction processing parts 12a, 12b, and 12c each perform. an actual error correction process. The error correction processing control parts 15a, 15b, and 15c included therein execute a program sequence corresponding to a predetermined decoding algorithm and issue control signals to the error correction computation parts 13a, 13b, and 13c, the memory banks 10a, 10b, and 10c, and the interconnect part 11. Each error correction computation part 13a-13c that has received the control signal executes the predetermined decoding algorithm with use of a data row inputted from the memory bank 10a, 10b, or 10c. The configuration data holding parts 14a, 14b, and 14c are connected to the external IF 16 so as to receive error correction configuration data from an external module.

The interconnect part 11 operates based upon group configuration information (data conversion configuration information or interconnect configuration information) obtained from the configuration data holding parts 14a, 14b, and 14c together with interconnect parameters (data conversion control information or interconnect control information) obtained from the error correction processing control parts 15a, 15b, and 15c in the error correction processing parts 12a-12c. The group configuration information and the interconnect parameters may be collectively referred to as control information.

The interconnect control part 11c determines group configuration of the cross bar 1a and the barrel shifter 11b based upon the group configuration information. Furthermore, the interconnect control part 11c controls a connection change in the cross bar 11a and a shift process of the barrel shifter 11b based upon the interconnect parameters. This allows a data row conversion such as interleaving for turbo decoding or barrel shifting for LDPC decoding.

Figure 5:
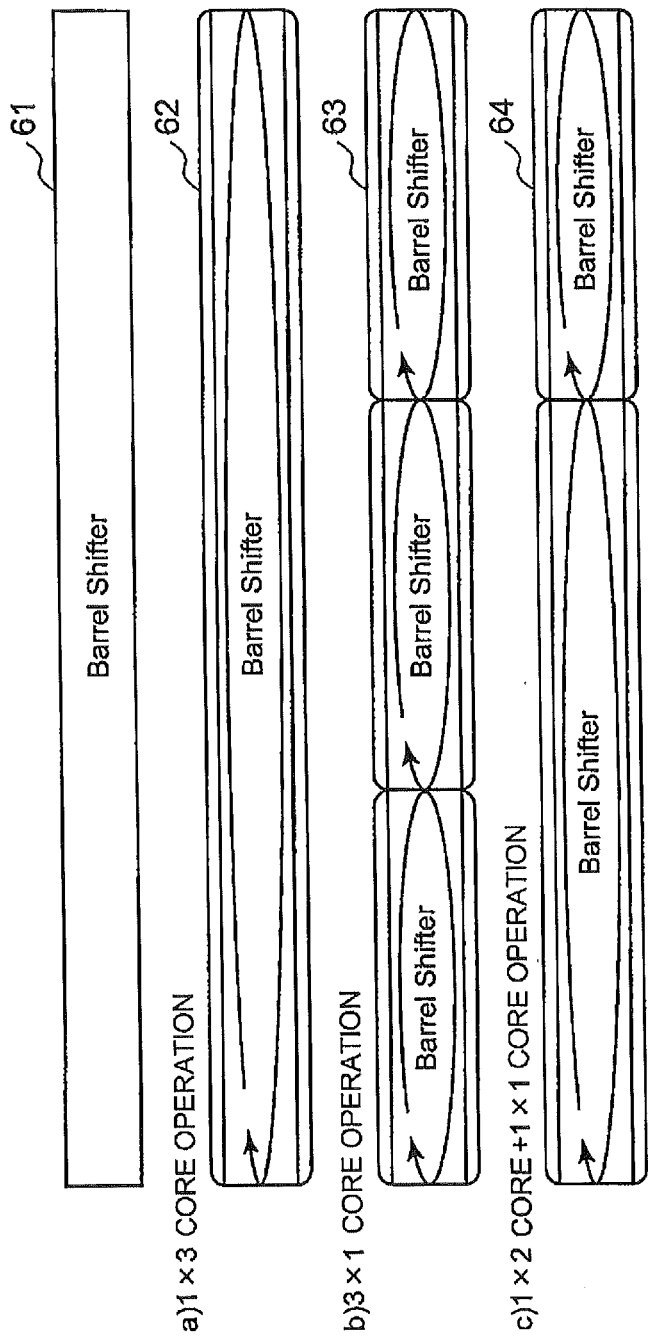
FIG. 5 is a diagram showing a specific example of group configuration of a barrel shifter for carrying out the present invention.
Figure 6:
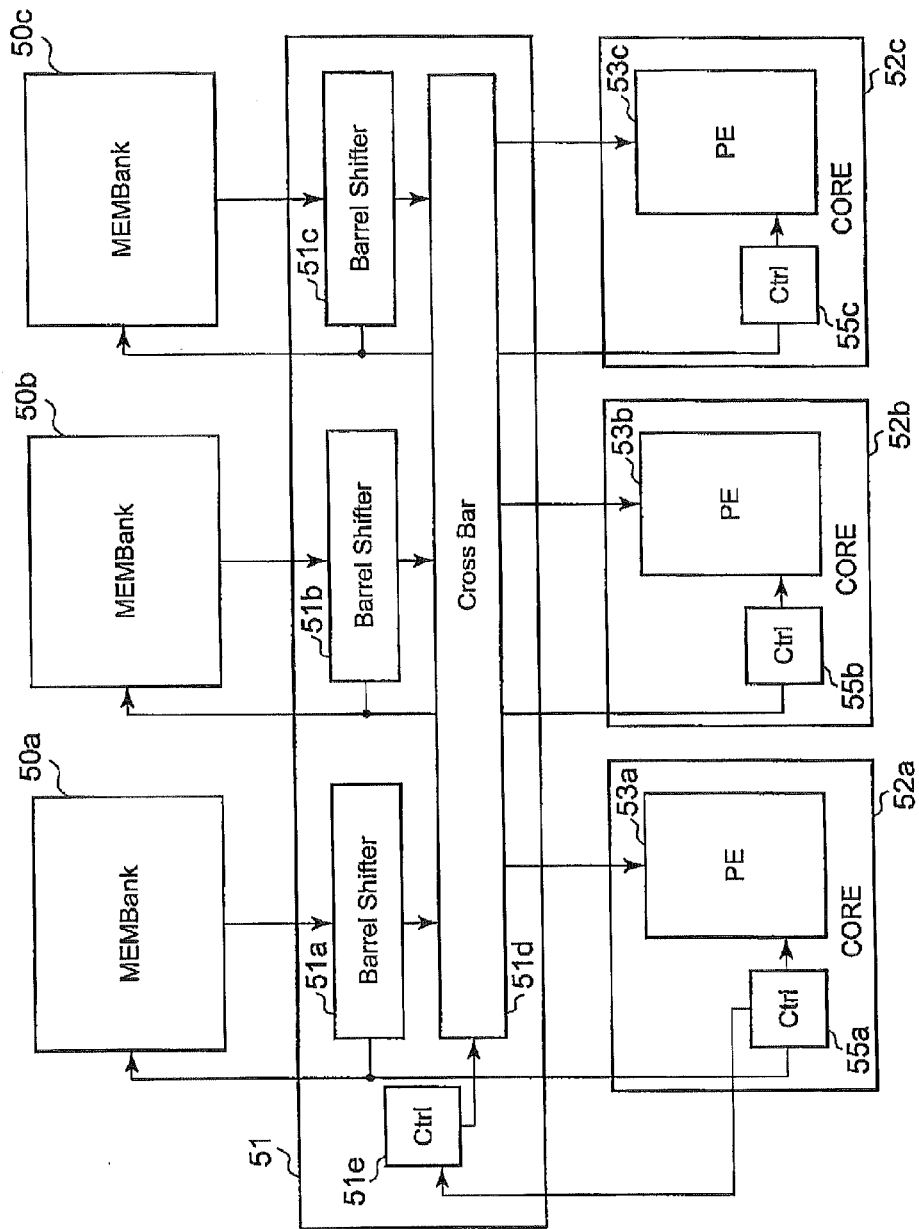
FIG. 6 is a block diagram showing an arrangement of an error correction processing apparatus related to the present invention.

FIG. 5 shows an arrangement of a barrel shifter 61 as an example of a group configuration method. As shown in FIG. 5, the barrel shifter 61 can be configured such that the three error correction processing parts 12a, 12b, and 12c are regarded as one group (see the reference numeral 62 of FIG. 5). In this case, the error correction processing apparatus of the present invention can deal with an error correction process of parallelism (specified by M×3).

As another example, by changing the group configuration information, the barrel shifter 61 can be configured such that each of the error correction processing parts 12a, 12b, and 12c is regarded as one group (see the reference numeral 63 of FIG. 5). In this case, the error correction processing apparatus has three groups in total and can deal with three error correction processes of parallelism specified by M. The three error correction processes can be executed simultaneously.

Furthermore, the barrel shifter 61 can be configured to have two groups, one of which includes the two error correction processing parts 12a and 12b and the other of which includes the error correction processing part 12c (see the reference numeral 64 of FIG. 5). In this case, the error correction processing apparatus can deal with an error correction process of parallelism specified by M×2 and an error correction process of parallelism specified by M. Both of the error correction processes can be executed simultaneously.

An overall operation of the multicore type error correction processing apparatus according to the first exemplary embodiment will be described in detail with reference to FIG. 1. The overall operation differs depending upon the group configuration of the interconnect part 11. Therefore, the overall operation will be described in connection with each of the aforementioned three cases described in the operation of the interconnect part 11.

Now, description would be made about the first case, i.e., the case where the barrel shifter in the interconnect part 11 is configured to have one group (capable of dealing with an error correction process having parallelism: M×3) by the group configuration information. Herein, let an LDPC decoding process be performed. The data to be subjected to LDPC decoding is assumed to have the code length equal to 768. In other words, it is assumed that 768 input data for an error correction process are stored in total in the memory banks 10a, 10b, and 10c. It is presumed that the number of data of 1 data row that can be stored in each of the memory banks 10a, 10b, and 10c is defined such that M=32. Specifically, since the number of the memory banks is three, the number of data readable and writable when all of the memory banks are simultaneously accessed is calculated by M×3=96. In this case, the error correction processing apparatus can perform one type of error correction process at one time. The operation of the error correction processing apparatus will be described below.

First, the external IF 16 supplies, to the configuration data holding parts 14a, 14b, and 14c, the group configuration information for the interconnect part 11 and information indicative of what error correction method is used for a process in the error correction processing parts 12a, 12b, and 12c (information corresponding to LDPC in this example). Then, based upon the obtained information, the error correction processing control parts 15a, 15b, and 15c in the error correction processing parts 12a, 12b, and 12c start to execute a program corresponding to an LDPC decoding process. When the program is executed, the error correction processing control parts 15a, 15b, and 15c output a read address to the memory banks 10a, 10b, and 10c.

Furthermore, the error correction processing control parts 15a, 15b, and 15c output interconnect parameters to the interconnect part 11. In the illustrated example, the interconnect parameters are sent to the interconnect control part 11c of the interconnect part 11. The memory banks 10a, 10b, and 10c read a desired data row based upon the received address. The read data row is outputted to the interconnect part 11.

Under control of the interconnect control part, 11c, the interconnect part 11 uses the barrel shifter 11b as a barrel shifter (62 of FIG. 5) for 96-data on the basis of the inputted data row, the interconnect parameters, and the group configuration information in the configuration data holding parts 14a, 14b, and 14c. At any rate, the interconnect part 11 performs a data row conversion under control of the interconnect control part 11c. After the data row conversion, the data rows are supplied to the error correction processing parts 12a, 12b, and 12c. When the data rows are inputted to the error correction computation parts 13a, 13b, and 13c, the error correction computation parts 13a, 13b, and 13c perform an LDPC decoding process for one repetition time. The obtained results are inputted to the interconnect part 11 again. Based upon the data rows inputted as computation results and the interconnect parameters, the interconnect part 11 performs a barrel shifter process that is reverse to the operation performed at the time of input to the error correction processing parts 12a-12c. The data rows recovered into the original order by the interconnect part 11 are inputted to the memory banks 10a, 10b, and 10c again. The data rows inputted as computation results to the memory banks 10a, 10b, and 10c are stored into predetermined addresses by write addresses generated in the error correction processing control parts 15a, 15b, and 15c.

An LDPC decoding process can be performed one repetition time by the above steps. This operation is repeated a predetermined number of times, so that desired LDPC decoding results can be obtained.

Next, description would be made about the second case, i.e., the case where the barrel shifter 11b in the interconnect part 11 is configured to have three groups (each being capable of dealing with an error correction process of parallelism: M) by the group configuration information. It is assumed that an LDPC decoding process is performed for three codes. The code length of data to be subjected to LDPC decoding is assumed to be 768. In other words, it is assumed that 768 input data for an error correction process are stored in each of the memory banks 10a-10c. It is assumed that the number of data of 1 data row that can be stored in each of the memory banks 10a, 10b, and 10c is defined such that M=32. Specifically, the number of data readable and writable when one of the memory banks is accessed becomes equal to M=32. In this case, the error correction processing apparatus can perform three different error correction processes at one time. The operation of the error correction processing apparatus will be described below.

First, the external IF 16 supplies, to the configuration data holding parts 14a, 14b, and 14c, the group configuration information for the interconnect part 11 and information indicative of what error correction method is used for a process in the error correction processing parts 12a, 12b, and 12c (information corresponding to LDPC in this example). Then, based upon the obtained information, the error correction processing control parts 15a, 15b, and 15c in the error correction processing parts 12a, 12b, and 12c start to execute a program corresponding to an LDPC decoding process. When the program is executed, the error correction processing control parts 15a, 15b, and 15c output a read address to the memory banks 10a, 10b, and 10c, respectively. Furthermore, the error correction processing control parts 15a, 15b, and 15c output interconnect parameters to the interconnect part 11. The memory banks 10a, 10b, and 10c read a desired data row based upon the received address. The three read data rows are outputted to the interconnect part 11.

The interconnect part 11 changes the barrel shifter 11b into three barrel shifters (63 of FIG. 5) for 32-data on the basis of the inputted data rows, the interconnect parameters, and the group configuration information in the configuration data holding parts 14a, 14b, and 14c, and performs a data row conversion. After the data row conversion, the data rows are supplied to the error correction processing parts 12a, 12b, and 12c, respectively. When the data rows are respectively inputted to the error correction computation parts 13a, 13b, and 13c, the error correction computation parts 13a, 13b, and 13c perform an LDPC decoding process for one repetition time. The obtained results are inputted to the interconnect part 11 again. Based upon the data rows inputted as computation results and the interconnect parameters, the interconnect part 11 performs a barrel shifter process that is reverse to the operation performed at the time of input to the error correction processing parts 12a-12c (i.e., a barrel shifter process for three barrel shifters for 32-data). The data rows recovered into the original order by the interconnect part 11 are inputted to the memory banks 10a, 10b, and 10c again. The data rows inputted as computation results to the memory banks 10a, 10b, and 10c are stored into predetermined addresses by write addresses generated in the error correction processing control parts 15a, 15b, and 15c.

The LDPC decoding process can be performed one repetition time by the above steps. This operation is repeated a predetermined number of repetition times, so that desired LDPC decoding results for three codes can be obtained.

Description would be made about the third case, i.e., the case where the barrel shifter 11b in the interconnect part 11 is configured to have two groups (one capable of dealing with an error correction process having parallelism of M×2 and one capable of dealing with an error correction process having parallelism of M) by the group configuration information. It is assumed that a turbo decoding process is to be performed for one code by the error correction processing parts 12a and 12b and that an LDPC decoding process is to be performed for one code by the error correction processing part 12c. The code length of data to be subjected to turbo decoding is assumed to be 512. The coding rate of turbo decoding is assumed to be 1/3. Specifically, the total code length of data to be subjected to turbo decoding is 1536. The code length of data to be subjected to LDPC decoding is assumed to be 768. In other words, it is assumed that 1536 input data for a turbo decoding process are stored in the memory banks 10a and 10b. It is assumed that 768 input data for an LDPC decoding process are stored in the memory bank 10c. It is assumed that the number of data of a single data row that can be stored in the memory banks 10a, 10b, and 10c is defined such that M=32. Specifically, the number of data readable and writable when one of the memory banks is accessed is calculated by M=32. In this case, the error correction processing apparatus can perform two types of error correction processes on data used at one time. The operation of the error correction processing apparatus will be described below.

First, the external IF 16 supplies, to the configuration data holding parts 14a, 14b, and 14c, group configuration information for the interconnect part 11 and information indicative of what error correction method is used for a process in the error correction processing parts 12a, 12b, and 12c (information commanding the error correction processing parts 12a and 12b to conduct turbo decoding and the error correction processing part 12c to conduct LDPC decoding in this example). Then, based upon the obtained information, the error correction processing control parts 15a, 15b, and 15c in the error correction processing parts 12a, 12b, and 12c start to execute a program corresponding to a turbo decoding process or an LDPC decoding process.

When the program is executed, the error correction processing control parts 15a, 15b, and 15c output a read address to the memory banks 10a, 10b, and 10c, respectively. Furthermore, the error correction processing control parts 15a, 15b, and 15c output interconnect parameters to the interconnect part 11. The memory banks 10a, 10b, and 10c read a desired data row based upon the received address. The three read data rows are outputted to the interconnect part 11.

The interconnect part 11 changes the barrel shifter 11b into one 32-data barrel shifter (62 of FIG. 5) based upon the inputted data rows, the interconnect parameters, and the group configuration information in the configuration data holding parts 14a, 14b, and 14c, and changes the configuration of the cross bar 11a such that the cross bar 11a is connected only to the two error correction processing parts 12a and 12b. The interconnect part 11 performs a data row conversion on the inputted data rows with the changed configuration. Specifically, the interconnect part 11 performs an interleaving process on the input data rows from the memory banks 10a and 10b when the repetition times are odd, and outputs the input data rows from the memory banks 10a and 10b without any data row conversion when the repetition times are even. Furthermore, the interconnect part 11 performs a barrel shifter process on the input data from the memory bank 10c.

After the data row conversion, the data rows are inputted to the error correction processing parts 12a, 12b, and 12c, respectively. When the data rows are respectively inputted to the error correction computation parts 13a, 13b, and 13c, the error correction computation parts 13a and 13b perform one repetition cycle of a turbo decoding process whereas the error correction computation part 13c performs one repetition cycle of an LDPC decoding process. The obtained results are inputted to the interconnect part 11 again. Based upon the data rows inputted as computation results and the interconnect parameters, the interconnect part 11 performs a data row conversion. Specifically, the interconnect part 11 allows the data rows outputted from the error correction computation parts 13a and 13b to go through when the count of repeated cycles is odd, and performs a de-interleaving process on the data rows outputted from the error correction computation parts 13a and 13b when the count of repeated cycles is even. Furthermore, the interconnect part 11 performs, on the data row outputted from the error correction computation part 13c, a barrel shifter process that is reverse to the operation performed at the time of input to the error correction processing part (i.e., a barrel shifter process for one 32-data barrel shifter). The data rows recovered into the original order by the interconnect part 11 are inputted to the memory banks 10a, 10b, and 10c again. The data rows inputted as computation results to the memory banks 10a, 10b, and 10c are stored into predetermined addresses by write addresses generated in the error correction processing control parts 15a, 15b, and 15c.

The turbo decoding process and the LDPC decoding process can be performed simultaneously with each other for the single repetition time. This operation is repeated a predetermined number of times, so that desired results of turbo decoding and LDPC decoding can be obtained.

As described above, in the first exemplary embodiment, the numbers of the error correction processing parts and the memory banks are equal to three. This is for the sake of brevity. The numbers of the error correction processing parts and the memory banks are not limited to three. Furthermore, in the first exemplary embodiment, a turbo decoding process and an LDPC decoding process have been described. However, since the three error correction processing parts 12a, 12b, and 12c can operate independently of each other, the error correction processing apparatus may process a combination of turbo decoding, LDPC decoding, and other error correction methods such as Viterbi decoding, or may process one method selected from among those methods. Any combination can be selected.

At any rate, it should be noted that the barrel shifter 11B performs a barrel shifter operation which includes a rotation operation based upon a shift process and which collectively indicates a group of the plurality of the error correction processing parts to be outputted or which individually indicates each of the plurality of the error correction processing parts in response to the control information. In this event, the rotation operation of the barrel shifter operation is implemented by successively shifting each data row within the barrel shifter 11b in a rotatable or cyclical manner.

Next, advantageous effects of the first exemplary embodiment will be described below.

In the multicore type error correction processing apparatus according to the first exemplary embodiment, the barrel shifter 11b in the interconnect part 11 is configured such that a plurality of error correction processing parts can form a variety of groups based upon the group configuration information stored in the configuration data holding parts 14a, 14b, and 14c and the interconnect parameters obtained from the error correction processing control parts 15a, 15b, and 15c. Therefore, one or more types of error correction processes, such as LDPC decoding and turbo coding, can simultaneously be performed with parallelism corresponding to various performance requirements as described above.

Second Exemplary Embodiment

Next, a multicore type error correction processing apparatus according to a second exemplary embodiment of the present invention will be described in detail with reference to the drawings.

The second embodiment is a variation of the first exemplary embodiment. Differences between the second exemplary embodiment and the first exemplary embodiment are as follows: In the first exemplary embodiment, the interconnect control part 11c in the interconnect part 11 is supplied with input signals through two lines of the error correction processing control parts 15a, 15b, and 15c and the configuration data holding parts 14a, 14b, and 14c. In the second exemplary embodiment, an interconnect control part 21c in an interconnect part 21 is supplied with input signals only through the configuration data holding parts 24.

Figure 2:
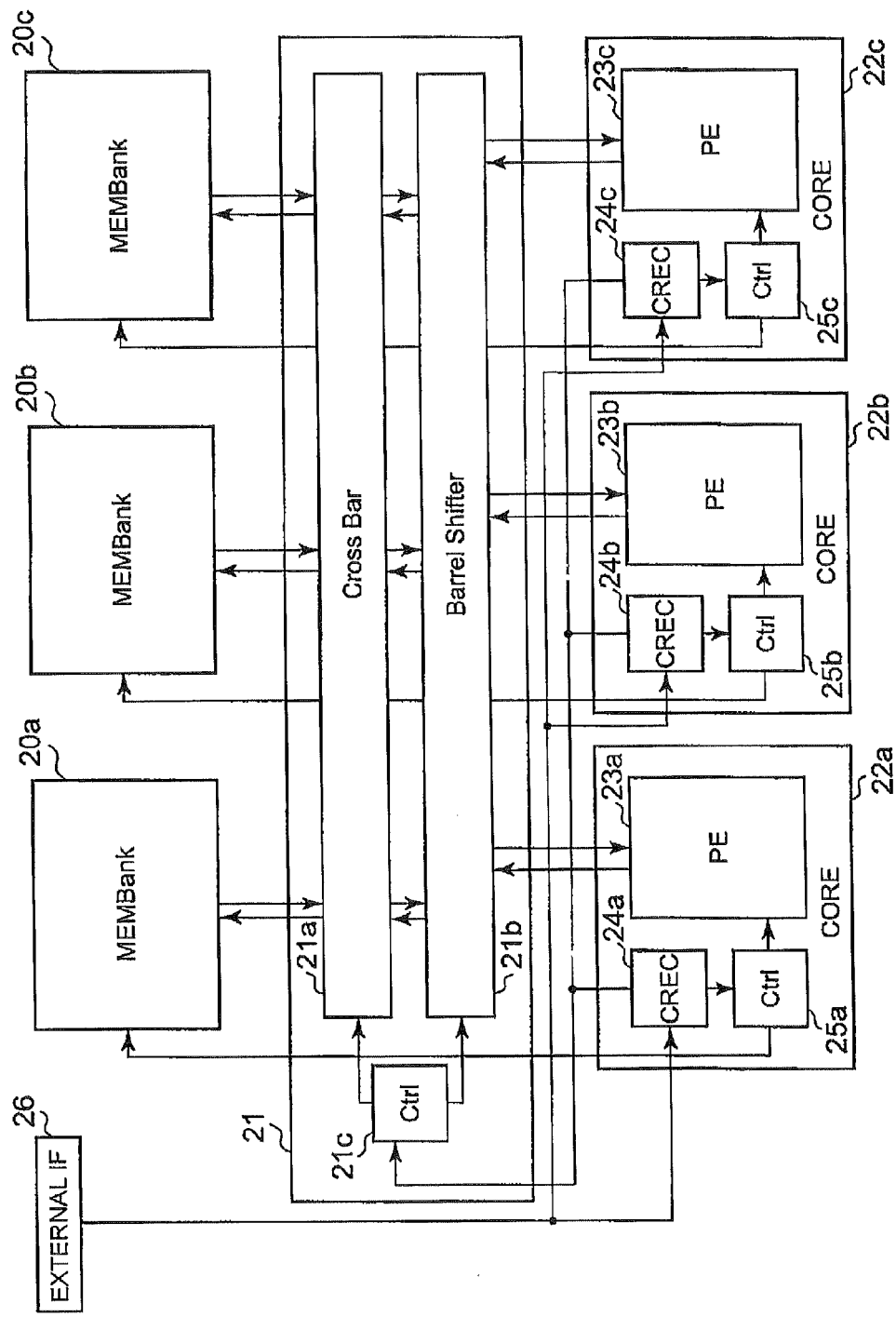
FIG. 2 is a block diagram showing an arrangement of an error correction processing apparatus according to a second embodiment of the present invention.

Specifically, the multicore type error correction processing apparatus according to the second exemplary embodiment includes a plurality of memory banks 20a, 20b, and 20c, a plurality of error correction processing parts 22a, 22b, and 22c, and the interconnect part 21, as illustrated in FIG. 2. The memory banks 20a, 20b, and 20c are used to store data to be processed (referred to as input data), data being computed, and the results. The error correction processing parts 22a, 22b, and 22c each perform an error correction process. The error correction processing parts 22a, 22b, and 22c include error correction computation parts 23a, 23b, and 23c operable to actually process received input data, error correction processing control parts 25a, 25b, and 25c operable to control the error correction computation parts 23a, 23b, and 23c and to generate memory addresses for the memory banks 20a, 20b, and 20c and interconnect parameters required for the interconnect part 21. In addition, configuration data holding parts 24a, 24b, and 24c are included in the error correction processing parts 22a, 22b, and 22c so as to hold group configuration information which is received from an external IF 26. The interconnect part 21 includes a cross bar 21a primarily used in turbo decoding, a barrel shifter 21b used in an LDPC decoding process, and the interconnect control part 21c operable to control the group configuration, operation, and the like.

Those components operate as follows.

The memory banks 20a, 20b, and 20c store data to be processed or computed. This is the same as in the first exemplary embodiment.

The error correction processing parts 22a, 22b, and 22c perform an actual error correction process. This is also the same as in the first exemplary embodiment.

The interconnect part 21 operates based upon group configuration information and interconnect parameters obtained from the configuration data holding parts 24a, 24b, and 24c. The interconnect control part 21c determines group configuration of the cross bar 21a and the barrel shifter 21b based upon the group configuration information. Furthermore, the interconnect control part 21c controls a connection change in the cross bar 21a and a shift process of the barrel shifter 21b based upon the interconnect parameters. This structure makes it possible to perform a data row conversion such as interleaving for turbo decoding and/or barrel shifting for LDPC decoding.

An example of a group configuration method will be described with reference to the barrel shifter 61 illustrated in FIG. 5 again. As shown in FIG. 5, the barrel shifter 61 can be configured such that the three error correction processing parts 22a, 22b, and 22c are regarded as one group (see the reference numeral 62 of FIG. 5). In this case, the error correction processing apparatus can deal with an error correction process of parallelism specified by M×3. As another example, by changing the group configuration information, the barrel shifter 21b can be configured such that each of the error correction processing parts 22a, 22b, and 22c is regarded as one group (see the reference numeral 63 of FIG. 5). In this case, the error correction processing apparatus has three groups in total and can deal with three error correction processes each having parallelism of M, which can be executed simultaneously with one another. Furthermore, the barrel shifter 21b can be configured to have two groups, one of which includes the two error correction processing parts 22a and 22b and the other of which includes the error correction processing part 22c (see the reference numeral 64 of FIG. 5). In this case, the error correction processing apparatus can deal with an error correction process having parallelism of M×2 and an error correction process having parallelism of M, which can be executed simultaneously with one another.

An overall operation of the multicore type error correction processing apparatus according to the second embodiment will be described in detail with reference to FIG. 2. The overall operation differs depending upon the group configuration of the interconnect part 21. Therefore, the overall operation will be described in connection with each of the aforementioned three cases described in the operation of the interconnect part 21.

Description will be made about the first case, i.e., the case where the barrel shifter in the interconnect part 21 is configured to have one group (capable of dealing with an error correction process having parallelism of M×3) by the group configuration information. It is assumed that an LDPC decoding process is to be performed. The code length of data to be subjected to LDPC decoding is assumed to be 768. In other words, it is assumed that 768 input data for an error correction process are stored in total in the memory banks. It is assumed that each of the memory banks 20a, 20b, and 20c can store data of a single data row defined by M=32 in number. Specifically, since the illustrated memory banks are equal in number to three, data simultaneously readable and writable are equal to M×3=96 in number. In this case, the error correction processing apparatus can perform one type of error correction process at one time. The operation of the error correction processing apparatus will be described below.

First, the external IF 26 supplies, to the configuration data holding parts 24a, 24b, and 24c, the group configuration information for the interconnect part 21, the interconnect parameters, and the information indicative of what error correction method is used for a process in the error correction processing parts 22a, 22b, and 22c (information corresponding to LDPC in this example). Then, based upon the obtained information, the error correction processing control parts 25a, 25b, and 25c in the error correction processing parts 22a, 22b, and 22c start to execute a program corresponding to an LDPC decoding process. When the program is executed, the error correction processing control parts 25a, 25b, and 25c output a read address to the memory banks 20a, 20b, and 20c. The memory banks 20a, 20b, and 20c read a desired data row based upon the received address. The read data row is outputted to the interconnect part 21.

The interconnect part 21 uses the barrel shifter 21b as a barrel shifter (62 of FIG. 5) for 96-data on the basis of the inputted data row, the group configuration information in the configuration data holding parts 24a, 24b, and 24c, and the interconnect parameters, and performs a data row conversion. After the data row conversion, the data rows are supplied to the error correction processing parts 22a, 22b, and 22c. When the data rows are given to the error correction computation parts 23a, 23b, and 23e, the error correction computation parts 23a, 23b, and 23e perform an LDPC decoding process of one repetition time. The obtained results are inputted to the interconnect part 21 again. Based upon the data rows inputted as computation results and the interconnect parameters, the interconnect part 21 performs a barrel shifter process that is reverse to the operation performed at the time of input to the error correction processing parts 22a-22c. The data rows recovered into the original order by the interconnect part 21 are inputted to the memory banks 20a, 20b, and 20c again. The data rows inputted as computation results to the memory banks 20a, 20b, and 20c are stored into predetermined addresses by write addresses generated in the error correction processing control parts 25a, 25b, and 25c.

Thus, the LDPC decoding process can be performed one repetition time by the above steps. This operation is repeated a predetermined number of times, so that desired LDPC decoding results can be obtained.

Description will be made about the second case, i.e., the case where the barrel shifter 21b in the interconnect part 21 is configured to have three groups (each being capable of dealing with an error correction process having parallelism of M) by the group configuration information. Let the LDPC decoding process be performed for three codes. The code length of data to be subjected to LDPC decoding is assumed to be 768. In other words, it is assumed that 768 input data for an error correction process are stored in each of the memory banks. It is also assumed that data of the single data row stored in each of the memory banks 20a, 20b, and 20c are equal in number to M=32. Specifically, the number of data readable and writable when one of the memory banks is accessed is defined by M=32. In this case, the error correction processing apparatus can perform three types of error correction processes at one time. The operation of the error correction processing apparatus will be described below.

First, the external IF 26 supplies, to the configuration data holding parts 24a, 24b, and 24c, the group configuration information for the interconnect part 21, the interconnect parameters, and the information indicative of what error correction method is used for a process in the error correction processing parts 22a, 22b, and 22c (information corresponding to LDPC in this example). Then, based upon the obtained information, the error correction processing control parts 25a, 25b, and 25c in the error correction processing parts 22a, 22b, and 22c start to execute a program corresponding to an LDPC decoding process. When the program is executed, the error correction processing control parts 25a, 25b, and 25c output a read address to the memory banks 20a, 20b, and 20c, respectively. The memory banks 20a, 20b, and 20c read a desired data row based upon the received address. The three read data rows are outputted to the interconnect part 21.

The interconnect part 21 changes the barrel shifter 21b into three barrel shifters (63 of FIG. 5) for 32-data on the basis of the inputted data rows, the group configuration information in the configuration data holding parts 24a, 24b, and 24c, and the interconnect parameters, and performs a data row conversion. After the data row conversion, the data rows are supplied to the error correction processing parts 22a, 22b, and 22c, respectively. When the data rows are respectively inputted to the error correction computation parts 23a, 23b, and 23c, the error correction computation parts 23a, 23b, and 23c perform an LDPC decoding process of one repetition time. The obtained results are inputted to the interconnect part 21 again. Based upon the data rows inputted as computation results and the interconnect parameters, the interconnect part 21 performs a barrel shifter process that is reverse to the operation performed at the time of input to the error correction processing parts (i.e., a barrel shifter process for three barrel shifters for 32-data). The data rows recovered into the original order by the interconnect part 21 are inputted to the memory banks 20a, 20b, and 20c again. The data rows inputted as computation results to the memory banks 20a, 20b, and 20c are stored into predetermined addresses by write addresses generated in the error correction processing control parts 25a, 25b, and 25c.

The LDPC decoding process can be performed one repetition time by the above steps. This process is repeated a predetermined number of times, so that desired LDPC decoding results for three codes can be obtained.

Description will be made about the third case, i.e., the case where the barrel shifter 21b in the interconnect part 21 is configured to have two groups (one capable of dealing with an error correction process having parallelism of M×2 and one capable of dealing with an error correction process having parallelism of M) by the group configuration information. It is assumed that a turbo decoding process is to be performed for one code by the error correction processing parts 22a and 22b and that an LDPC decoding process is to be performed for one code by the error correction processing part 22c. The code length of data to be subjected to turbo decoding is assumed to be 512. The coding rate of turbo decoding is assumed to be 1/3. Specifically, the total code length of data to be subjected to turbo decoding is 1536. The code length of data to be subjected to LDPC decoding is assumed to be 768. In other words, it is assumed that 1536 input data for a turbo decoding process are stored in the memory banks 20a and 20b. it is assumed that 768 input data for an LDPC decoding process are stored in the memory bank 20c. It is assumed that the number of data of the single data row that can be stored in the memory banks 20a, 20b, and 20c is defined such that M=32. Specifically, the number of data readable and writable when one of the memory banks is accessed is calculated by M=32.

In this case, the error correction processing apparatus can perform two types of error correction processes on data used at one time. The operation of the error correction processing apparatus will be described below.

First, the external IF 26 supplies, to the configuration data holding parts 24a, 24b, and 24c, the group configuration information for the interconnect part 21, the interconnect parameters, and the information indicative of what error correction method is used for a process in the error correction processing parts 22a, 22b, and 22c (information commanding the error correction processing parts 22a and 22b to conduct turbo decoding and the error correction processing part 22c to conduct LDPC decoding in this example). Then, based upon the obtained information, the error correction processing control parts 25a, 25b, and 25c in the error correction processing parts 22a, 22b, and 22c start to execute a program corresponding to a turbo decoding process or an LDPC decoding process. When the program is executed, the error correction processing control parts 25a, 25b, and 25c output a read address to the memory banks 20a, 20b, and 20c, respectively. The memory banks 20a, 20b, and 20c read a desired data row based upon the received address. The three read data rows are outputted to the interconnect part 21.

The interconnect part 21 changes the barrel shifter 21b into one barrel shifter (62 of FIG. 5) for 32-data in response to the inputted data rows, the group configuration information in the configuration data holding parts 24a, 24b, and 24c, and the interconnect parameters, and changes the configuration of the cross bar 21a such that the cross bar 21a is connected only to the two error correction processing parts 22a and 22b. The interconnect part 21 performs a data row conversion on the inputted data rows with the changed configuration. Specifically, the interconnect part 21 performs an interleaving process on the input data rows from the memory banks 20a and 20b when the repetition times are odd, and outputs the input data rows from the memory banks 20a and 20b without any data row conversion when the repetition times are even. Furthermore, the interconnect part 21 performs a barrel shifter process on the input data from the memory bank 20c. After the data row conversion, the data rows are supplied to the error correction processing parts 22a, 22b, and 22c, respectively. When the data rows are respectively inputted to the error correction computation parts 23a, 23b, and 23c, the error correction computation parts 23a and 23b perform a turbo decoding process of one repetition time whereas the error correction computation part 23c performs the LDPC decoding process one repetition time. The obtained results are inputted to the interconnect part 21 again.

Based upon the data rows inputted as computation results and the interconnect parameters, the interconnect part 21 performs a data row conversion. Specifically, the interconnect part 21 makes it possible to pass through the data rows outputted from the error correction computation parts 23a and 23b when the repetition times are odd, and to perform a de-interleaving process on the data rows outputted from the error correction computation parts 23a and 23b when the repetition times are even. Furthermore, the interconnect part 21 performs, on the data row outputted from the error correction part 23c, a barrel shifter process that is reverse to the operation performed at the time of input to the error correction processing part (i.e., a barrel shifter process for one barrel shifter for 32-data). The data rows recovered into the original order by the interconnect part 21 are supplied to the memory banks 20a, 20b, and 20c again. The data rows inputted as computation results to the memory banks 20a, 20b, and 20c are stored into predetermined addresses by write addresses generated in the error correction processing control parts 25a, 25b, and 25c.

The turbo decoding process and the LDPC decoding process can be performed simultaneously one repetition time by the above steps. This process is repeated a predetermined number of times, so that desired results of turbo decoding and LDPC decoding can be obtained.

In the second exemplary embodiment, the numbers of the error correction processing parts and the memory banks are three. This is for the sake of brevity. The numbers of the error correction processing parts and the memory banks are not limited to three. Furthermore, in the second exemplary embodiment, the turbo decoding process and the LDPC decoding process have been described. However, since the three error correction processing parts 22a, 22b, and 22c can operate independently of each other, the error correction processing apparatus may process a combination of turbo decoding, LDPC decoding, and other error correction methods such as Viterbi decoding, or may process one method selected from among those methods. Any combination can be selected.

Next, advantageous effects of the second exemplary embodiment will be described below.

In the multicore type error correction processing apparatus according to the second exemplary embodiment, the barrel shifter 21b in the interconnect part 21 is configured such that a plurality of error correction processing parts can form various groups based upon group configuration information stored in the configuration data holding parts 24a, 24b, and 24c. Therefore, one or more types of error correction, such as LDPC decoding, can simultaneously be performed with parallelism corresponding to various performance requirements. Furthermore, unlike the first exemplary embodiment, data required to control the interconnect part 21 may be stored only in the configuration data holding parts 24a, 24b, and 24c in the second exemplary embodiment. Accordingly, a programming process becomes relatively simple, and reduction of the circuit scale can be expected with regard to the control system.

Third Exemplary Embodiment

Next, a third exemplary embodiment of the present invention will be described in detail with reference to the drawings. The third exemplary embodiment is also a variation of the first exemplary embodiment. Differences between the third exemplary embodiment and the first exemplary embodiment are as follows: In the first exemplary embodiment, the interconnect control part 11c in the interconnect part 11 are supplied with input signals through two lines of the error correction processing control parts 15a, 15b, and 15c and the configuration data holding parts 14a, 14b, and 14c. In the third exemplary embodiment, the interconnect control part 31c in the interconnect part 31 is supplied with input signals only from the error correction processing control parts 35a, 35b, and 35c. This structure is also different from that illustrated in FIG. 3 because the latter has the interconnect part 21 connected to the configuration data holding parts 24a, 24b, and 24c 24a-24c.

Figure 3:
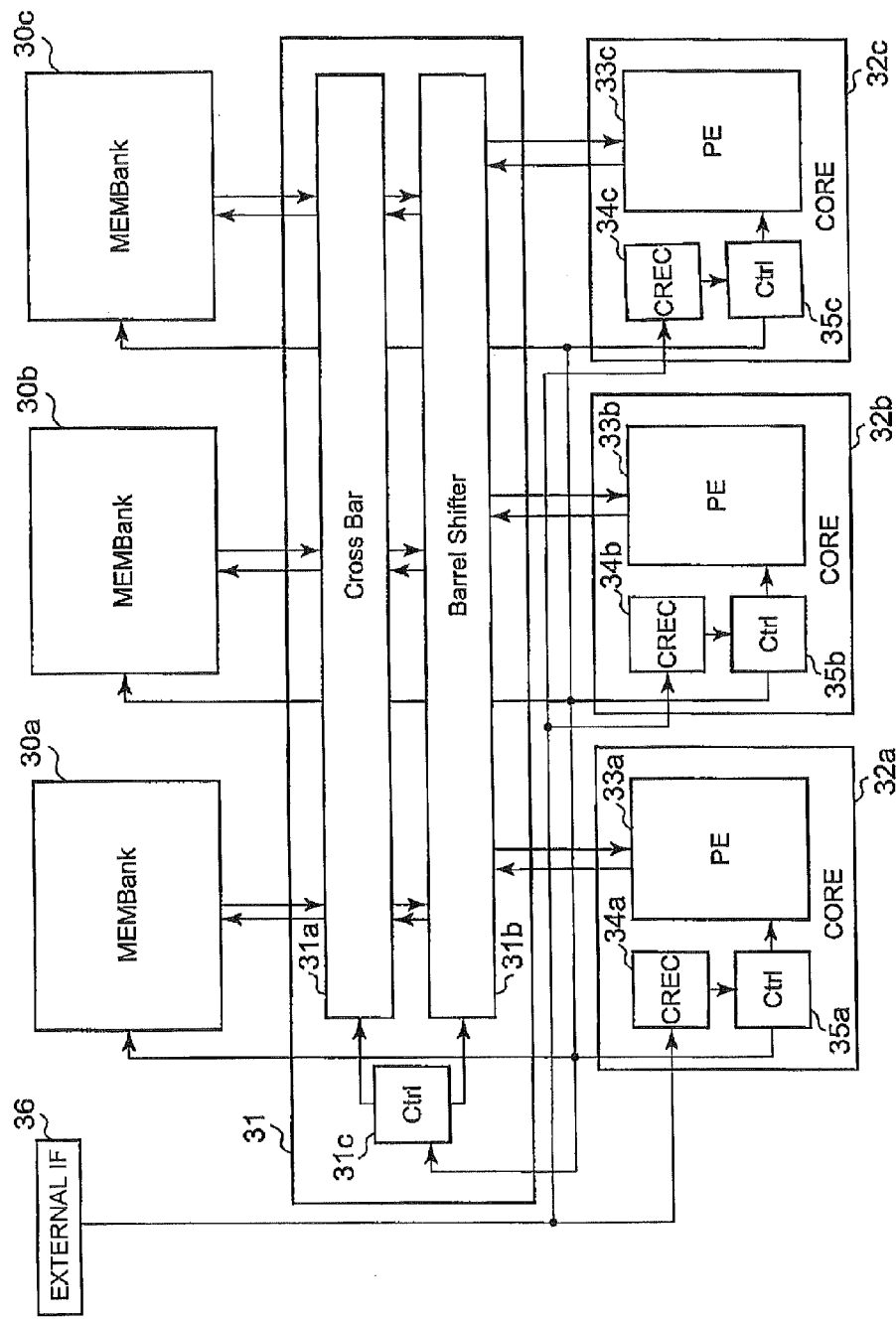
FIG. 3 is a block diagram showing an arrangement of an error correction processing apparatus according to a third embodiment of the present invention.
Figure 4:
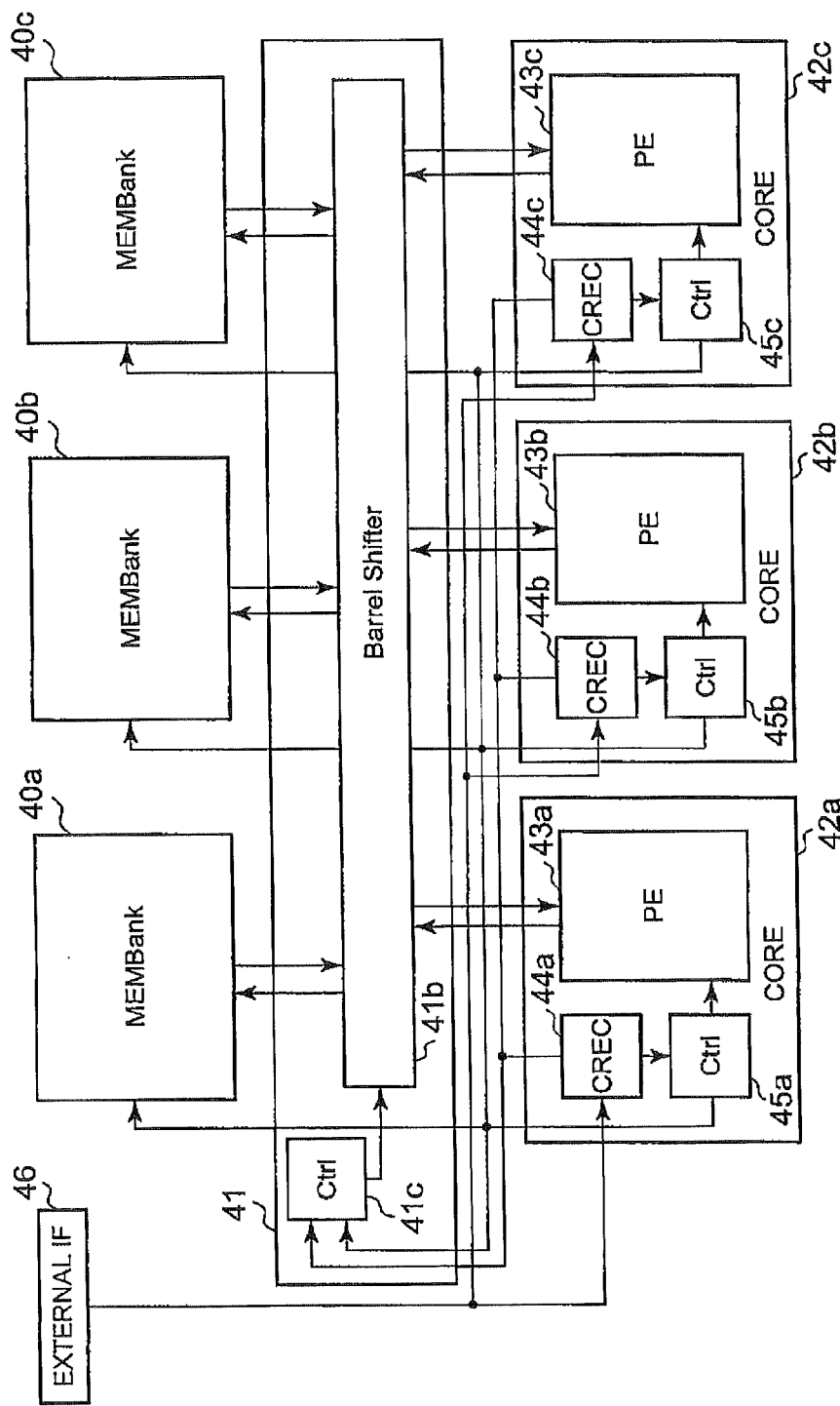
FIG. 4 is a block diagram showing an arrangement of an error correction processing apparatus according to a fourth embodiment of the present invention.

Referring to FIG. 3, the multicore type error correction processing apparatus according to the third exemplary embodiment includes a plurality of memory banks 30a, 30b, and 30c, a plurality of error correction processing parts 32a, 32b, and 32c, and the interconnect part 31.

The memory banks 30a, 30b, and 30c are used to store data to be processed (referred to as input data), data being computed, and the results. The error correction processing parts 32a, 32b, and 32c perform an error correction process. The error correction processing parts 32a, 32b, and 32c include error correction computation parts 33a, 33b, and 33c operable to actually process received input data and error correction processing control parts 35a, 35b, and 35c operable to control the error correction computation parts 33a, 33b, and 33c and to generate memory addresses for the memory banks 30a, 30b, and 30c and interconnect parameters required for the interconnect part 31. In addition, configuration data holding parts 34a, 34b, and 34c hold configuration parameters which are indicative of the error correction processing parts 32a, 32b, and 32c and which are received from the external IF 36. The interconnect part 31 includes a cross bar 31a primarily used in turbo decoding, a barrel shifter 31b used in an LDPC decoding process, and an interconnect control part 31c operable to control the group configuration, operation, and the like.

Those components operate as follows.

The memory banks 30a, 30b, and 30c store data to be computed or processed. This is the same as in the first exemplary embodiment.

The error correction processing parts 32a, 32b, and 32c perform an actual error correction process. This is also the same as in the first exemplary embodiment. The interconnect part 31 operates on the basis of the group configuration information and the interconnect parameters obtained from the error correction processing control parts 35a, 35b, and 35c in the error correction processing part 32a, 32b, and 32c. The interconnect control part 31c determines group configuration of the cross bar 31a and the barrel shifter 31b with reference to the group configuration information. Furthermore, the interconnect control part 31c controls a connection change in the cross bar 31a and a shift process of the barrel shifter 31b based upon the interconnect parameters. This makes it possible to perform a data row conversion such as interleaving for turbo decoding or barrel shifting for LDPC decoding.

An example of a group configuration method of the third exemplary embodiment is explained again by the use of the barrel shifter 61 illustrated in FIG. 5. As shown in FIG. 5, the barrel shifter 61 can be configured such that the three error correction processing parts 32a, 32b, and 32c are regarded as one group (see the reference numeral 62 of FIG. 5). In this case, the error correction processing apparatus can deal with an error correction process having parallelism of M×3. As another example, by changing the group configuration information, the barrel shifter 61 can be configured such that each of the error correction processing parts 32a, 32b, and 32c is regarded as one group (see the reference numeral 63 of FIG. 5). In this case, the error correction processing apparatus has three groups in total and can deal with three error correction processes each having parallelism of M, which can be executed simultaneously. Furthermore, the barrel shifter 61 can be configured to have two groups, one of which includes the two error correction processing parts 32a and 32b, the other of which includes the error correction processing part 32c (see the reference numeral 64 of FIG. 5). In this case, the error correction processing apparatus can deal with an error correction process having parallelism of M×2 and an error correction process having parallelism of M, which can be executed simultaneously.

An overall operation of the multicore type error correction processing apparatus according to the third exemplary embodiment will be described in detail with reference to FIG. 3. The overall operation differs depending upon the group configuration of the interconnect part 31. Therefore, the overall operation will be described in connection with each of the aforementioned three cases described in the operation of the interconnect part 31.

Description will be made about the first case, i.e., the case where the barrel shifter 31b in the interconnect part 31 is configured to have one group (capable of dealing with an error correction process having parallelism of M×3). It is assumed that an LDPC decoding process is to be performed. The code length of data to be subjected to LDPC decoding is assumed to be 768. In other words, it is assumed that 768 input data for an error correction process are stored in total in the memory banks. It is assumed that the number of data of 1 data row that can be stored in each of the memory banks 30a, 30b, and 30c is defined such that M=32. Specifically, since the number of the memory banks is three, the number of data readable and writable when all of the memory banks are simultaneously accessed is calculated by M×3=96. In this case, the error correction processing apparatus can perform one type of error correction process at one time. The operation of the error correction processing apparatus will be described below.

First, the external IF 36 supplies, to the configuration data holding parts 34a, 34b, and 34c, the group configuration information for the interconnect part 31 and information indicative of what error correction method is used for a process in the error correction processing parts 32a, 32b, and 32c (information corresponding to LDPC in this example). Then, based upon the obtained information, the error correction processing control parts 35a, 35b, and 35c in the error correction processing parts 32a, 32b, and 32c start to execute a program corresponding to an LDPC decoding process. When the program is executed, the error correction processing control parts 35a, 35b, and 35c output a read address to the memory banks 30a, 30b, and 30c. The error correction processing control parts 35a, 35b, and 35c output interconnect parameters and group configuration information to the interconnect part 31. The memory banks 30a, 30b, and 30c read a desired data row based upon the received address. The read data row is outputted to the interconnect part 31.

The interconnect part 31 uses the barrel shifter 31b as a barrel shifter (62 of FIG. 5) for 96-data on the basis of the inputted data row, the interconnect parameters, and the group configuration information, and performs a data row conversion. After the data row conversion, the data rows are supplied to the error correction processing parts 32a-32c. When the data rows are inputted to the error correction computation parts 33a, 33b, and 33c, the error correction computation parts 33a, 33b, and 33c perform the LDPC decoding process one repetition time. The obtained results are supplied to the interconnect part 31 again. Based upon the data rows inputted as computation results and the interconnect parameters, the interconnect part 31 performs a barrel shifter process that is reverse to the operation performed at the time of input to the error correction processing parts. The data rows recovered into the original order by the interconnect part 31 are supplied to the memory banks 30a, 30b, and 30c again. The data rows supplied as computation results to the memory banks 30a, 30b, and 30c are stored into predetermined addresses by write addresses generated in the error correction processing control parts 35a, 35b, and 35c.

The LDPC decoding process can be performed one repetition time by the above steps. This process is repeated a predetermined number of times, so that desired LDPC decoding results can be obtained.

Description will be made about the second case, i.e., the case where the barrel shifter 31b in the interconnect part 31 is configured to have three groups (each being capable of dealing with an error correction process having parallelism of M). It is assumed that the LDPC decoding process is to be performed for three codes. The code length of data to be subjected to LDPC decoding is assumed to be 768. In other words, it is assumed that 768 input data for an error correction process are stored in each of the memory banks. It is assumed that data of the single data row that can be stored in each of the memory banks 30a, 30b, and 30c are equal in number to M=32. Specifically, the number of data readable and writable when one of the memory banks is accessed is calculated such that M=32. In this case, the error correction processing apparatus can perform three types of error correction processes at one time. The operation of the error correction processing apparatus will be described below.

First, the external IF 36 supplies, to the configuration data holding parts 34a, 34b, and 34c, the group configuration information for the interconnect part 31 and the information indicative of what error correction method is used for a process in the error correction processing parts 32a, 32b, and 32c (information corresponding to LDPC in this example). Then, based upon the obtained information, the error correction processing control parts 35a, 35b, and 35c in the error correction processing parts 32a, 32b, and 32c start to execute a program corresponding to the LDPC decoding process. When the program is executed, the error correction processing control parts 35a, 35b, and 35c output a read address to the memory banks 30a, 30b, and 30c, respectively. Furthermore, the error correction processing control parts 35a, 35b, and 35c output interconnect parameters and group configuration information to the interconnect part 31. The memory banks 30a, 30b, and 30c read a desired data row based upon the received address. The three read data rows are outputted to the interconnect part 31.

The interconnect part 31 changes the barrel shifter 31b into three barrel shifters (63 of FIG. 5) for 32-data on the basis of the inputted data rows, the interconnect parameters, and the group configuration information, and performs a data row conversion. After the data row conversion, the data rows are supplied to the error correction processing parts 32a, 32b, and 32c, respectively. When the data rows are respectively inputted to the error correction computation parts 33a, 33b, and 33c, the error correction computation parts 33a, 33b, and 33c perform the LDPC decoding process one repetition time. The obtained results are inputted to the interconnect part 31 again.

Based upon the data rows inputted as computation results and the interconnect parameters, the interconnect part 31 performs a barrel shifter process that is reverse to the operation performed at the time of input to the error correction processing parts (i.e., a barrel shifter process for three 32-data barrel shifters). The data rows recovered into the original order by the interconnect part 31 are supplied to the memory banks 30a, 30b, and 30c again. The data rows inputted as computation results to the memory banks 30a, 30b, and 30c are stored into predetermined addresses by write addresses generated in the error correction processing control parts 35a, 35b, and 35c.

The LDPC decoding process can be performed one repetition time by the above steps. This process is repeated a predetermined number of times, so that desired LDPC decoding results for three codes can be obtained.

Description will be made about the third case, i.e., the case where the barrel shifter 31b in the interconnect part 31 is configured to have two groups (one capable of dealing with an error correction process having parallelism of M×2 and one capable of dealing with an error correction process having parallelism of M). It is assumed that a turbo decoding process is to be performed for one code by the error correction processing parts 32a and 32b and that an LDPC decoding process is to be performed for one code by the error correction processing part 32c. The code length of data to be subjected to turbo decoding is assumed to be 512. The coding rate of turbo decoding is assumed to be 1/3. Specifically, the total code length of data to be subjected to turbo decoding is 1536. The code length of data to be subjected to LDPC decoding is assumed to be 768. In other words, it is assumed that 1536 input data for a turbo decoding process are stored in the memory banks 30a and 30b. It is assumed that 768 input data for an LDPC decoding process are stored in the memory bank 30c. It is assumed that the number of data of the single data row that can be stored in the memory banks 30a, 30b, and 30c is defined such that M=32. Specifically, the number of data readable and writable when one of the memory banks is accessed is calculated by M=32. In this case, the error correction processing apparatus can perform two types of error correction processes on data used at one time. The operation of the error correction processing apparatus will be described below.

First, the external IF 36 supplies, to the configuration data holding parts 34a, 34b, and 34c, the group configuration information for the interconnect part 31 and information indicative of what error correction method is used for a process in the error correction processing parts 32a, 32b, and 32c (information commanding the error correction processing parts 32a and 32b to conduct turbo decoding and the error correction processing part 32c to conduct LDPC decoding in this example). Then, based upon the obtained information, the error correction processing control parts 35a, 35b, and 35c in the error correction processing parts 32a, 32b, and 32c start to execute a program corresponding to a turbo decoding process or an LDPC decoding process. When the program is executed, the error correction processing control parts 35a, 35b, and 35c output a read address to the memory banks 30a, 30b, and 30c, respectively. Furthermore, the error correction processing control parts 35a, 35b, and 35c output interconnect parameters and group information to the interconnect part 31. The memory banks 30a, 30b, and 30c read a desired data row based upon the received address. The three read data rows are outputted to the interconnect part 31.

The interconnect part 31 changes the barrel shifter 31b into one barrel shifter (62 of FIG. 5) for 32-data on the basis of the inputted data rows, the interconnect parameters, and the group configuration information, and changes the configuration of the cross bar 31a such that the cross bar is connected only to the two error correction processing parts 32a and 32b. The interconnect part 31 performs a data row conversion on the inputted data rows with the changed configuration. Specifically, the interconnect part 31 performs an interleaving process on the input data rows from the memory banks 30a and 30b when the repetition times are odd, and outputs the input data rows from the memory banks 30a and 30b without any data row conversion when the repetition times are even. Furthermore, the interconnect part 31 performs a barrel shifter process on the input data from the memory bank 30c.

After the data row conversion, the data rows are supplied to the error correction processing parts 32a, 32b, and 32c, respectively. When the data rows are respectively inputted to the error correction computation parts 33a, 33b, and 33c, the error correction computation parts 33a and 33b perform one repetition time of a turbo decoding process whereas the error correction computation part 33c performs one repetition time of an LDPC decoding process.

The obtained results are inputted to the interconnect part 31 again. Based upon the data rows inputted as computation results and the interconnect parameters, the interconnect part 31 performs a data row conversion. Specifically, the interconnect part 31 allows the data rows outputted from the error correction computation parts 33a and 33b to go through when the repetition times are odd, and performs a de-interleaving process on the data rows outputted from the error correction computation parts 33a and 33b when the repetition times are even. Furthermore, the interconnect part 31 performs, on the data row supplied from the error correction computation part 33c, a barrel shifter process that is reverse to the operation performed at the time of input to the error correction processing part (i.e., a barrel shifter process for one barrel shifter for 32-data). The data rows recovered into the original order by the interconnect part 31 are inputted to the memory banks 30a, 30b, and 30c again. The data rows supplied as computation results to the memory banks 30a, 30b, and 30c are stored into predetermined addresses by write addresses generated in the error correction processing control parts 35a, 35b, and 35c.

Thus, the turbo decoding process and the LDPC decoding process can be performed simultaneously one repetition time by the above steps. This process is repeated a predetermined number of times, so that desired results of turbo decoding and LDPC decoding can be obtained.

In the third exemplary embodiment, the numbers of the error correction processing parts and the memory banks are three. This is for the sake of brevity. The numbers of the error correction processing parts and the memory banks are not limited to three. Furthermore, in the third exemplary embodiment, the turbo decoding process and the LDPC decoding process have been described. However, since the three error correction processing parts 32a, 32b, and 32c can operate independently of each other, the error correction processing apparatus may process a combination of turbo decoding, LDPC decoding, and other error correction methods such as Viterbi decoding, or may process one method selected from among those methods. Any combination can be selected.

Next, advantageous effects of the third embodiment will be described below.

In the multicore type error correction processing apparatus according to the third exemplary embodiment, the barrel shifter 31b in the interconnect part 31 is configured such that a plurality of error correction processing parts can form various groups based upon interconnect parameters and group configuration information obtained from the error correction processing control parts 35a, 35b, and 35c. Therefore, one or more types of error correction, such as turbo decoding and LDPC decoding, can simultaneously be performed with parallelism corresponding to various performance requirements. Furthermore, unlike the second exemplary embodiment, data required to control the interconnect part 31 are generated by the error correction processing control parts 35a-35c. Accordingly, the interconnect part 31 can be controlled without any latency inputted from the exterior of the interconnect part 31. Thus, reduction of the circuit scale can be expected with regard to the control system.

Fourth Exemplary Embodiment

Next, a fourth exemplary embodiment of the present invention will be described in detail with reference to the drawings. The fourth embodiment is a variation of the first embodiment. Differences between the fourth exemplary embodiment and the first exemplary embodiment are as follows: The cross bar 11a of the first exemplary embodiment is omitted from the multicore type error correction processing apparatus in the fourth exemplary embodiment. In other words, the error correction processing apparatus of the fourth exemplary embodiment has an interconnect part 41 only including a barrel shifter 41b and an interconnect control part 41c. The operation of the error correction processing apparatus is the same as in the first exemplary embodiment. According to the fourth exemplary embodiment, an error correction processing system can be applicable to LDPC coding which has different code lengths, and the circuit scale can further be reduced.

INDUSTRIAL APPLICABILITY

The present invention is applicable to an error correction processing apparatus in a wireless communication system or the like.

Next, additional features of the present invention would be enumerated below.

A multicore type error correction processing system according to an embodiment of the present invention may comprise: a plurality of data storage parts; a data row conversion part for receiving data from the plurality of data storage parts and converting an order of data in a data row; an external input part for receiving a control parameter from an exterior of the external input part; an external parameter storage part for storing data received from the external input part; and a plurality of error correction processing parts for receiving data from the data row conversion part and performing a predetermined error correction process based upon a parameter stored in the external parameter storage part, wherein the error correction processing part includes an error correction computation part and an error correction processing control part for controlling the error correction computation part so as to perform the error correction process based upon the parameter stored in the external parameter storage part, and the data row conversion part performs a data row conversion using a barrel shifter operation which includes a rotation operation based upon a shift process and which collectively indicates a group of the plurality of the error correction processing parts to be outputted or which individually indicates each of the plurality of the error correction processing parts in response to the control information.

The multicore type error correction processing system may further comprise a cross bar located between the plurality of the data storages and the barrel shifter to deliver the data row from each of the data storages to the barrel shifter in response to the control information. The above-mentioned multicore type correction processing system is effective to process a plurality of different codes, such as LDPC codes and turbo codes.

A multicore type error correction processing method according to another embodiment of the present invention is used in a multicore type error correction processing system including: a plurality of data storage parts, a data row conversion part for receiving data from the plurality of data storage parts and converting an order of data in a data row, an external input part for receiving a control parameter from an exterior of the external input part, an external parameter storage part for storing data received from the external input part, and a plurality of error correction processing parts for receiving data from the data row conversion part and performing a predetermined error correction process based upon a parameter stored in the external parameter storage part. The error correction processing method is characterized in that: the error correction processing part performs an error correction computation process and an error correction processing control for controlling the error correction computation process so as to perform a predetermined error correction process based upon a parameter stored in the external parameter storage part, and the data row conversion part performs a data row conversion by using a barrel shifter operation which includes a rotation operation based upon a shift process and which collectively indicates a group of the plurality of error correction processing parts to be outputted or which individually indicates each of the error correction processing parts to be outputted in response to the control information.

This application is based upon and claims the benefit of priority from Japanese patent application No. 2010-225403, filed on Oct. 5, 2010, the disclosure of which is incorporated herein in its entirety by reference.

REFERENCE SIGNS LIST 10a-10c, 20a-20c, 30a-30c, 40a-40c, 50a-50c Memory bank
11, 21, 31, 41, 51 Interconnection part
11a, 21a, 31a, 51a Cross bar
11b, 21b, 31b, 41b, 51b, 61 Barrel shifter
11c, 21c, 31c, 41c, 51c Interconnection control part
12a-12c, 22a-22c, 32a-32c, 42a-42c, 52a-52c Error correction processing part
13a-13c, 23a-23c, 33a-33c, 43a-43c, 53a-53c Error correction computation part
14a-14c, 24a-24c, 34a-34c, 44a-44c Configuration data holding part
15a-15c, 25a-25c, 35a-35c, 45a-45c, 55a-55c Error correction processing control part
16, 26, 36, 46 External IF.

The invention claimed is:

1. A multicore type error correction processing system, comprising:
   a plurality of data storages;
   a data row converter which receives stored data from the plurality of data storages to convert an order of stored data in a data row to obtain converted data; and
   a plurality of error correction processors which receive the converted data from the data row converter to perform a predetermined error correction process based upon parameter data stored in an external parameter storage,
   wherein the data row converter performs a data row conversion in response to control information which includes group configuration information determining a group configuration of the plurality of the error correction processors,
   wherein the data row converter comprises a barrel shifter operable in accordance with the group configuration information to perform a barrel shifter operation which includes a rotation operation based upon a shift process, the barrel shifter being selectively operable in accordance with the group configuration information to collectively indicate a group of the plurality of the error correction processors to be outputted and to individually indicate the plurality of the error correction processors.

2. The multicore type error correction processing system as recited in claim 1, wherein the data row converter is supplied as the control information with data row conversion control information obtained from the error correction processors and data row conversion-configuration information stored in the external parameter storage.

3. The multicore type error correction processing system as recited in claim 1, wherein the data row converter is supplied as the control information with data row conversion control information obtained from the error correction processors.

4. The multicore type error correction processing system as recited in claim 1, wherein the data row converter is supplied with the control information and comprises:
   a cross bar located between the plurality of the data storages and the barrel shifter to deliver the data row from each of the data storages to the barrel shifter in response to the control information.

5. The multicore type error correction processing system as recited in claim 1, wherein the barrel shifter indicates the group of the plurality of the error correction processors in the response to the group configuration information.

6. The multicore type error correction processing system as recited in claim 1, wherein the barrel shifter selects the plurality of error correction processors by performing the barrel shifter operation in accordance with the group configuration information.

7. The multicore type error correction processing system as recited in claim 1, wherein a number of the error correction processors in the group of the plurality of the error correction processors corresponds to a number of an error correction process of parallelism.

8. The multicore type error correction processing system as recited in claim 1, wherein the data row converter comprises:
   a cross bar located between the plurality of the data storages and the barrel shifter to deliver the data row from each of the data storages to the barrel shifter in response to the control information.

9. A multicore type error correction processing apparatus, comprising:
   a plurality of memory banks;
   an interconnect part including a barrel shifter operable to receive data from the plurality of memory banks, to shift a data row of the data for converting an order of the data, and to generate output data;
   an external interface operable to receive a control parameter from an exterior of the external interface;
   an external parameter holding part operable to store control parameter data received from the external interface; and
   a plurality of error correction processing parts which are operable to receive the output data from the interconnect part and which each perform a predetermined error correction process based upon the control parameter data stored in the external parameter holding part,
   wherein the error correction processing parts each includes an error correction computation part and an error correction processing control part operable to control the error correction computation part so as to perform the error correction process based upon the control parameter data stored in the external parameter holding part,
   wherein the interconnect part is responsive to the control parameter data and group configuration information for determining a group of the error correction processing parts to perform a data row conversion,
   wherein the barrel shifter performs a barrel shifter operation which includes a rotation operation based on a shift process in response to the group configuration information, and
   wherein the barrel shifter is selectively operable in response to the group configuration information to collectively indicate a group of the plurality of the error correction processing parts to be outputted and to individually indicate each of the plurality of the error correction processing parts to be outputted.

10. The multicore type error correction processing system as recited in claim 9, wherein the interconnect part is supplied as the control parameter data with interconnect control information obtained from the error correction processing control parts included in the error correction processing parts and with interconnection configuration information stored in the external parameter holding part, and
   wherein the interconnect part performing, by using both the interconnect control information and the interconnection configuration information, the data row conversion by using the barrel shifter operation which includes the rotation operation based upon the shift process and which collectively indicates the group of the plurality of the error correction processing parts to be outputted or individually indicates each of the plurality of the error correction processing parts to be outputted.

11. The multicore type error correction processing system as recited in claim 9, wherein the interconnect part is supplied as the control parameter data with interconnect control information obtained from the error correction processing control parts included in the error correction processing parts to perform the data row conversion due to the barrel shifter operation which collectively indicates the group of the plurality of the error correction processing parts to be outputted or which individually indicates each of the plurality of the error correction processing parts to be outputted.

12. The multicore type error correction processing system as recited in claim 9, wherein the interconnect part is supplied as the control parameter data with interconnection configuration information stored in the external parameter holding part to performs the data row conversion due to the barrel shifter operation which collectively indicates the group of the plurality of the error correction processing parts to be outputted or which individually indicates each of the plurality of the error correction processing parts to be outputted.

13. The multicore type error correction processing system as recited in claim 9, wherein the barrel shifter indicates the group of the plurality of the error correction processing parts in the response to the group configuration information.

14. The multicore type error correction processing system as recited in claim 9, wherein the barrel shifter selects the plurality of error correction processors parts by performing the barrel shifter operation in accordance with the group configuration information.

15. The multicore type error correction processing system as recited in claim 9, wherein a number of the error correction processors parts in the group of the plurality of the error correction processors parts corresponds to a number of an error correction process of parallelism.

16. The multicore type error correction processing system as recited in claim 9, wherein the data row converter comprises:
a cross bar located between the plurality of the data storages and the barrel shifter to deliver the data row from each of the data storages to the barrel shifter in response to the control information.

17. A processing method, comprising:
receiving a data row and control information concerned with the data row;
performing a data row conversion in response to the control information which includes group configuration information determining a group configuration of a plurality of error correction processing parts; and
performing, by a barrel shifter operable in accordance with the group configuration information, a barrel shifter operation which includes a rotation operation based upon a shift process, the barrel shifter being selectively operable in accordance with the group configuration information to collectively indicate a group of the plurality of the error correction processing parts to be outputted and to individually indicate the plurality of the error correction processing parts.

18. The processing method as recited in claim 17, used in a multicore type error correction processing system which includes:
a plurality of data storages,
a data row conversion part which receives data from the plurality of the data storages and which converts an order of data in the data row,
an external input register which receives the control information, and
the plurality of error correction processing parts as output devices, the plurality of the error correction processing parts receiving data from the data row conversion part and performing a predetermined error correction process based upon the control information,
the performing the barrel shifter operation comprising:
receiving the control information; and
carrying out, in response to the control information, the barrel shifter operation which includes the rotation operation based upon the shift process and which collectively indicates the group of the-error correction processing parts as the output devices or which individually indicates each of the error correction processing parts as the output devices.

19. The processing method as recited in claim 17, wherein said performing the barrel shifter operation comprises indicting, by the barrel shifter, the group of the plurality of the error correction processors in the response to the group configuration information.

20. The processing method as recited in claim 17, wherein said performing the barrel shifter operation comprises selecting, by the barrel shifter, the plurality of error correction processors by performing the barrel shifter operation in accordance with the group configuration information.

\* \* \* \* \*